United States Patent
Ozguz et al.

(10) Patent No.: US 7,786,562 B2
(45) Date of Patent: Aug. 31, 2010

(54) STACKABLE SEMICONDUCTOR CHIP LAYER COMPRISING PREFABRICATED TRENCH INTERCONNECT VIAS

(76) Inventors: Volkan Ozguz, 34 Lyon Ridge, Aliso Viejo, CA (US) 92656; Angel Pepe, 55 Rocking Horse Rd., Rancho Palos Verdes, CA (US) 92705; James Yamaguchi, 29462 Castle Rd., Laguna Niguel, CA (US) 92677; W. Eric Boyd, 39 Albergar, San Clemente, CA (US) 92672; Douglas Albert, 17743 Plum Tree La., Yorba Linda, CA (US) 92886; Andrew Camien, 1605 White Oak St., Costa Mesa, CA (US) 92626

(*) Notice: Subject to any disclaimer, the term of this patent is extended or adjusted under 35 U.S.C. 154(b) by 305 days.

(21) Appl. No.: 11/150,712

(22) Filed: Jun. 10, 2005

(65) Prior Publication Data

US 2005/0277288 A1    Dec. 15, 2005

Related U.S. Application Data

(60) Continuation-in-part of application No. 11/003,429, filed on Dec. 6, 2004, which is a continuation-in-part of application No. 10/663,371, filed on Sep. 16, 2003, now abandoned, which is a division of application No. 10/197,006, filed on Jul. 16, 2002, now abandoned, which is a continuation-in-part of application No. 09/190,378, filed on Nov. 10, 1998, now abandoned.

(60) Provisional application No. 60/410,895, filed on Sep. 16, 2002, provisional application No. 60/065,088, filed on Nov. 11, 1997, provisional application No. 60/305,353, filed on Jul. 16, 2001.

(51) Int. Cl.
*H01L 23/02* (2006.01)

(52) U.S. Cl. .......... 257/686; 257/750; 257/774; 257/777; 257/E25.006; 257/E25.013; 257/E25.018; 257/E25.021; 257/E25.027; 257/E23.085

(58) Field of Classification Search .......... 257/686, 257/777, E25.006, E25.013, E25.018, E25.021, 257/E25.027, E23.085, E21.614, 774, 723, 257/750; 438/109, FOR. 368, FOR. 426
See application file for complete search history.

(56) References Cited

U.S. PATENT DOCUMENTS 3,943,918 A    3/1976 Lewis
(Continued)

FOREIGN PATENT DOCUMENTS

DE    20106542    6/2001
(Continued)

OTHER PUBLICATIONS

DeMeis, Rick, "Flex Sensor to Investigate Sleep Disorder," *Design News*, Jun. 6, 2009, http://www.desiqnnews.com/article/CA86 896.html.
(Continued)

*Primary Examiner*—Jasmine J Clark

(57) ABSTRACT

A stackable layer and stacked multilayer module are disclosed. Individual integrated circuit die are tested and processed at the wafer level to create vertical area interconnect vias for the routing of electrical signals from the active surface of the die to the inactive surface. Vias are formed at predefined locations on each die on the wafer at the reticle level using a series of semiconductor processing steps. The wafer is passivated and the vias are filled with a conductive material. The bond pads on the die are exposed and a metallization reroute from the user-selected bond pads and vias is applied. The wafer is then segmented to form thin, stackable layers that can be stacked and vertically electrically interconnected using the conductive vias, forming high-density electronic modules which may, in turn, be further stacked and interconnected to form larger more complex stacks.

34 Claims, 2 Drawing Sheets

U.S. PATENT DOCUMENTS

| | | | |
|---|---|---|---|
| 4,525,921 A | 7/1985 | Carson | |
| 4,646,128 A | 2/1987 | Carson | |
| 4,981,141 A | 1/1991 | Segalowitz | |
| 5,168,874 A | 12/1992 | Segalowitz | |
| 5,181,025 A | 1/1993 | Ferguson et al. | |
| 5,307,818 A | 5/1994 | Segalowitz | |
| 5,311,399 A | 5/1994 | Zeil et al. | |
| 5,324,687 A | 6/1994 | Wojnarowski | |
| 5,338,432 A | 8/1994 | Agarwala et al. | |
| 5,404,044 A * | 4/1995 | Booth et al. | 257/698 |
| 5,480,842 A | 1/1996 | Clifton et al. | |
| 5,511,553 A | 4/1996 | Segalowitz | |
| 5,528,222 A | 6/1996 | Moskowitz et al. | |
| 5,536,768 A | 7/1996 | Kantner et al. | |
| 5,543,660 A | 8/1996 | Dombroski | |
| 5,675,180 A * | 10/1997 | Pedersen et al. | 257/685 |
| 5,682,062 A * | 10/1997 | Gaul | 257/686 |
| 5,719,437 A | 2/1998 | Clifton et al. | |
| 5,733,814 A | 3/1998 | Flesher et al. | |
| 5,811,877 A | 9/1998 | Miyano et al. | |
| 5,864,175 A | 1/1999 | Burns | |
| 5,865,741 A | 2/1999 | Kelly et al. | |
| 5,973,396 A | 10/1999 | Farnworth | |
| 6,044,293 A | 3/2000 | Lucey, Jr. et al. | |
| 6,066,093 A | 5/2000 | Kelly et al. | |
| 6,075,712 A | 6/2000 | McMahon | |
| 6,157,851 A | 12/2000 | Kelly et al. | |
| 6,198,168 B1 * | 3/2001 | Geusic et al. | 257/774 |
| 6,219,568 B1 | 4/2001 | Kelly et al. | |
| 6,219,569 B1 | 4/2001 | Kelly et al. | |
| 6,236,115 B1 * | 5/2001 | Gaynes et al. | 257/774 |
| 6,264,614 B1 | 7/2001 | Albert et al. | |
| 6,278,890 B1 | 8/2001 | Chassaing et al. | |
| 6,289,238 B1 | 9/2001 | Besson et al. | |
| 6,326,544 B1 | 12/2001 | Lake | |
| 6,359,840 B1 | 3/2002 | Evans | |
| RE37,637 E | 4/2002 | Clifton et al. | |
| 6,385,473 B1 | 5/2002 | Haines et al. | |
| 6,392,143 B1 | 5/2002 | Koshio | |
| 6,399,178 B1 | 6/2002 | Chung | |
| 6,416,471 B1 | 7/2002 | Kumar et al. | |
| 6,434,420 B1 | 8/2002 | Taheri | |
| 6,434,421 B1 | 8/2002 | Taheri | |
| 6,438,413 B1 | 8/2002 | Taheri | |
| 6,441,747 B1 | 8/2002 | Khair et al. | |
| 6,448,174 B1 | 9/2002 | Ramm | |
| 6,450,953 B1 | 9/2002 | Place et al. | |
| 6,454,708 B1 | 9/2002 | Ferguson et al. | |
| 6,488,029 B1 | 12/2002 | Hood et al. | |
| 6,494,829 B1 | 12/2002 | New et al. | |
| 6,496,705 B1 | 12/2002 | Ng et al. | |
| 6,553,251 B1 | 4/2003 | Lahdesmaki | |
| 6,560,109 B2 | 5/2003 | Yamaguchi et al. | |
| 6,564,079 B1 | 5/2003 | Cory et al. | |
| 6,577,893 B1 | 6/2003 | Besson et al. | |
| 6,669,663 B1 | 12/2003 | Thompson | |
| 2002/0010390 A1 | 1/2002 | Guice et al. | |
| 2002/0045836 A1 | 4/2002 | Alkawwas | |
| 2002/0144182 A1 | 10/2002 | Cavalli | |
| 2002/0164840 A1 | 11/2002 | Lu et al. | |
| 2002/0169635 A1 | 11/2002 | Shillingburg | |
| 2002/0180605 A1 | 12/2002 | Ozguz et al. | |
| 2002/0183646 A1 | 12/2002 | Stivoric et al. | |

FOREIGN PATENT DOCUMENTS

| | | |
|---|---|---|
| EP | 0676717 | 10/1995 |
| EP | 0772153 | 5/1997 |
| EP | 1028463 | 8/2000 |
| EP | 1048264 | 11/2000 |
| EP | 1070479 | 1/2001 |
| JP | 05074934 | 3/1993 |
| JP | 09169186 | 6/1997 |
| JP | 10041424 | 2/1998 |
| WO | WO 9009143 | 8/1990 |
| WO | WO 9401039 | 1/1994 |
| WO | WO 9925019 | 5/1999 |

OTHER PUBLICATIONS

EPO Communication for Application No. 02805694.3 dated Aug. 22, 2008.

International Search Report for PCT/US02/22617 completed Mar. 4, 2004.

International Preliminary Examination Report of for PCT/US02/22617 completed Feb. 2, 2005.

Supplementary European Search Report for EP application No. 02805694.3 dated Dec. 18, 2006.

* cited by examiner

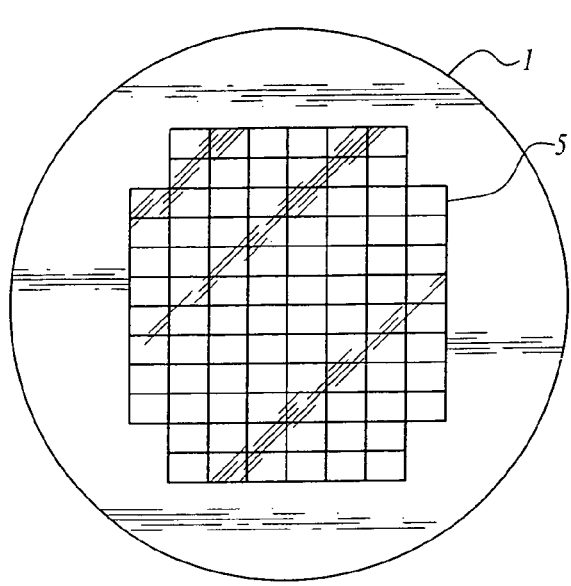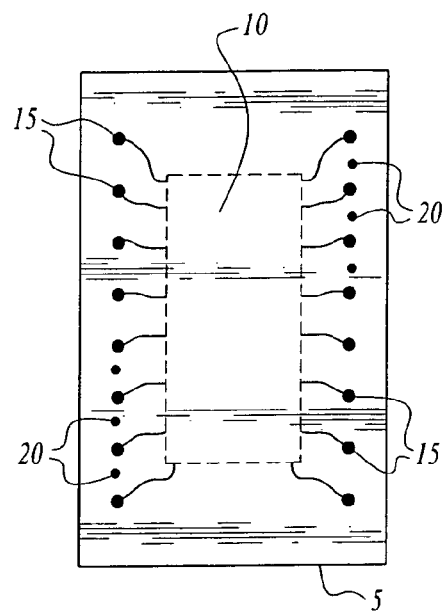
Fig. 1
Fig. 2
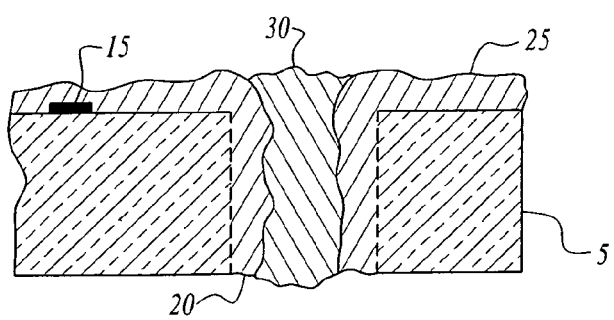
Fig. 3
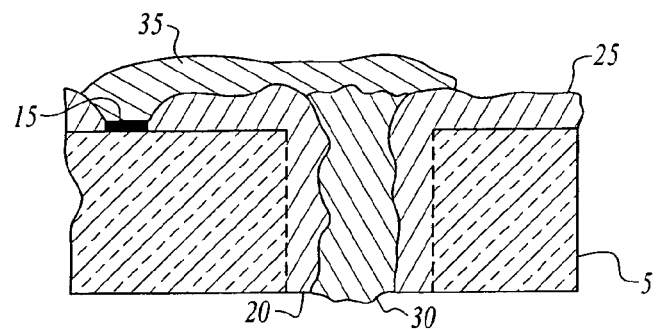
Fig. 4

STACKABLE SEMICONDUCTOR CHIP LAYER COMPRISING PREFABRICATED TRENCH INTERCONNECT VIAS

REFERENCE TO RELATED APPLICATIONS

This application is a continuation in part of U.S. patent application Ser. No. 10/663,371, filed on Sep. 16, 2003, now abandoned entitled "Stacked Microelectronic Module With Vertical Interconnect Vias", which in turn, claims priority to provisional application No. 60/410,895, filed on Sep. 16, 2002, and this application is a continuation in part of U.S. patent application Ser. No 11/003,429 filed on Dec. 6, 2004, entitled "Wearable Biomonitor With Flexible Thinned Integrated Circuit", which, in turn is a division of application Ser. No. 10/197,006 filed on Jul. 16, 2002, now abandoned which is a continuation-in-part of U.S. patent application Ser. No. 09/190,378 filed Nov. 10, 1998, now abandoned entitled "Method for Thinning Semiconductor Wafers with Circuits and Wafers Made by the Same", which claims the benefit of provisional application Ser. No. 60/065,088, filed Nov. 11, 1997, entitled "Method for Thinning Semiconductor Wafers with Circuits" and claims the benefit of U.S. provisional patent application Ser. No. 60/305,353, filed Jul. 16, 2001, entitled "Biomonitor Device", all of which are incorporated herein by reference.

BACKGROUND OF THE INVENTION

1. Field of the Invention

The invention relates to electronic integrated circuit chips. Specifically, the invention relates to a method for forming conductive vias in semiconductor wafers and die to form high density electrical interconnection structures and a device made from the method.

2. Description of the Prior Art

Industry continues to seek devices that allow high-density electronic circuitry to occupy a very small space. Satellites, aerospace applications, military weaponry and surveillance, and consumer electronics all require ever-smaller electronic circuitry. It has been determined that stacking layers of electronic circuitry and vertically interconnecting the layers provides a significant increase in circuit density per unit area. Examples of related three-dimensional stacking inventions are disclosed in a number of patents issued to common assignee, Irvine Sensors Corp., such as U.S. Pat. No. 6,560,109, U.S. Pat. No. 4,525,921, and U.S. Pat. No. 4,646,128, each of which is incorporated herein by reference.

High-speed electronic applications operating in the gigahertz range also create unique circuit design concerns with respect to capacitance, inductance and "time of flight" for electron travel. Shorter lead lengths within a high-speed circuit help minimize these design concerns.

It has been determined that stacking of individual, unpackaged, integrated circuit die allows for a very small form factor, while achieving ultra-high circuit density and minimal lead lengths. But stacking of individual circuit die undesirably includes yield problems when a stack includes a failed layer, as well as complications related to interfacing, wire bonding and/or side-bussing of stacked integrated circuit die. Additionally, wirebonding interface interconnects creates longer lead lengths with associated problems of cross talk and electron time of flight.

Conductive via interconnects can be used beneficially to electrically connect a semiconductor layer with electronic circuitry with an adjacent layer but, because of the fabrication processes associated with via formation, existing electronic circuitry can be damaged during via formation. This is because via formation presently occurs after the electronic circuitry is formed on the semiconductor wafer of substrate. Because of the photolithographic and etching processes associated with via formation, the fragile electronic circuitry on a die or wafer can easily be damaged.

Therefore, a need exists in the art which allows for the efficient, scalable stacking of integrated circuit die which reduces yield problems, manufacturing concerns and problems associated with wire bonding and unnecessary lead lengths.

SUMMARY OF THE INVENTION

The present invention includes stackable layers comprised of individual, pretested integrated circuit die, or substrates, that are unpackaged. One or more vias, or trenches, are formed at predetermined locations on individual integrated circuit die preferably at the wafer level as part of the semiconductor process steps used to define the electronic circuitry on the substrate. The trenches are formed concurrently with and as part of the electronic circuit fabrication. Deep reactive ion etching (DRIE) processes are used, such as are used in DRAM trench capacitor formation, to form very small, high aspect ratio trenches. Typical DRIE processes include SF6 reaction which is suitable for forming high aspect ratio trenches with well-defined, vertical side walls.

A passivating, dielectric layer is disposed on the internal surface of the trench cavity and a conductive material (e.g., doped polysilicon or metal) is disposed upon the dielectric layer within the trench. Preferably, the trench is substantially filled with the conductive material. These DRIE, passivating and metalizing processes are compatible with the processes involved in the formation of electronic circuitry on a semiconductor wafer and are performed during wafer fabrication, i.e., the trench features are defined as part of the reticle set/ photomask set associated with the electronic circuitry defined on the substrate.

The active, or first, surface of the wafer that contains the electronic circuitry is passivated with a suitable insulative material such as an oxide. The individual die's bond pads are exposed through the passivation layer at the wafer level. Electrically conductive traces between the exposed bond pads and/or conductive material with the trenches are formed the wafer level using well-established metal plating processes.

In one aspect of the invention, the inactive, or second, surface of the wafer is backthinned using conventional thinning techniques to expose the conductive material in the trench to create a through-hole via that can be accessed from the first and second surface of the substrate. The individual integrated circuits can be diced from the wafer, individually, or as an array of multiple uncut die, using a dicing saw.

In another aspect of the invention, the die streets (inactive borders of individual die on the active surface of a wafer) on an unthinned wafer can be grooved to a predetermined depth and the active surface of the wafer bonded to a substrate. The entire wafer can then be backthinned to expose the conductive material within the trench and beyond the depth of the preformed groove, resulting in the low mechanical stress singulation of the individual die of the wafer.

The individual die or array of die are bonded together and electrically interconnected at the predetermined vias and bond pads so as to form "ministacks" comprising two to four layers. Solder reflow, if appropriate is performed to provide electrical connection of the solder at the via/bond pad interface. Alternatively, a Z-conductive or anisotropic epoxy may be used to bond and interconnect the layers. These ministacks are tested and may be assembled into larger stacks which are ensured of containing functional layers. The second surface of the bottom-most die in the stack may have vias or ball bonds which can be interconnected to external circuitry.

In this manner, very small form factor, multilayer stacks of individual integrated circuit die are achieved with minimal lead lengths, with or without the use of external side bus conductors.

Accordingly, the invention provides a stackable, integrated circuit die layer that is highly reliable and which may be interconnected to adjacent layers using vertical area vias as well as a multilayer module comprised of such layers that is low-cost, easy to test and assemble in high volume.

BRIEF DESCRIPTION OF THE DRAWINGS

FIG. 1 is a plan view of a wafer with individual integrated circuit die formed on the first surface of the wafer.

FIG. 2 shows an integrated circuit die of the present invention with active circuitry, bond pads and vias formed therein.

FIG. 3 illustrates a cross-section of a die of the present invention after application of a dielectric layer and conductive via fill.

FIG. 4 is a cross-section of the die of FIG. 3 after exposure of the bond pad and electrical interconnection to the via.

DETAILED DESCRIPTION OF THE INVENTION

Figure 5:
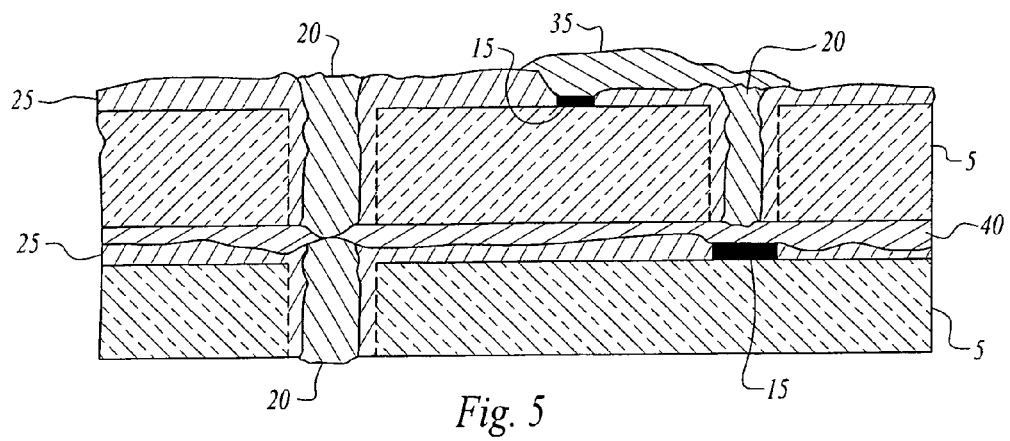
FIG. 5 shows two of the layers of the present invention in an electrically interconnected ministack.

Turning now to the figures wherein like numerals designate like elements among the several views, FIG. 1 shows a substrate such as a semiconductor wafer 1 with individual integrated circuit die 5 formed thereon. FIG. 2 illustrates a more detailed view of individual die 5 of wafer 1, showing active circuitry 10 formed on die 5 and bonding pads 15 in electrical connection with active circuitry 10 for the routing of signals and power into and out of die 5.

In the invention's preferred embodiment, die 5 are tested at the wafer level to ensure the use of functional die within a stack and to identify functional die or sets of die (arrays) on the wafer. Additionally, because of the flexibility of the invention, both individual die or matching layers of equal sized die arrays on a wafer may be concurrently processed under the proposed invention.

FIG. 1 further illustrates one or more vias 20 formed in each die 5 on wafer 1, at predetermined locations using industry standard dry etch or laser drill techniques, depending on the substrate material. Vias 20 are preferably 1-10 microns in diameter, extending completely through the substrate and may be formed using any process capable of creating high aspect ratio vias through the substrate as will be discussed below.

Wafer passivation across all die on the wafer is performed to insulate circuitry and vias and to provide control of via capacitance. FIG. 3 shows a cross-section of a portion of die 5 after the application of a passivation layer 25 within via 20 and over bond pad 15. In the preferred embodiment, atomic layer deposition (ALD) of a suitable dielectric layer such as silicon oxide or thermal oxide is used to ensure pinhole free passivation coverage and because of ALD's ability to control dielectric thickness and related via capacitance.

As can be seen in FIG. 3, an electrically conductive material 30 is then deposited in the vias, using, for instance, chemical vapor deposition (CVD) applied copper/tungsten or doped polysilicon material to create an electrically conductive path through die 5.

The unique ability to vary the via formation, dielectric application and conductive via fill processes to control via diameter, dielectric thickness and via conductor diameter also allow the formation of various in situ passive components such as capacitors and resistors at and within the via sites and layer.

Turning now to FIG. 4, bond pads 15 are exposed through passivation layer 25 on each die 5 on the wafer using conventional photolithographic techniques. Conductive metallization interconnects 35 are formed to interconnect desired exposed filled vias and/or bond pads on the die using industry standard techniques After wafer level via/bond pad interconnection, the inactive surface of the wafer optionally may be back-thinned using mechanical or chemical techniques as are well known it the art such as grinding and/or remote atmospheric plasma etching, alternative embodiments of which will be further discussed.

Further testing to identify functional die or die arrays is preferably performed prior to segmenting of the wafer into individual die or die arrays.

Die 5 are segmented from wafer 1 prior to interconnection and stacking.

Turning to FIG. 5, segmented die, preferably two to four die, are bonded together with an adhesive 40 and are electrically interconnected at predetermined vias and/or bond pads. Alternative preferred embodiments include using a Z-conductive epoxy such as ZTP8090FP available from AI Tech or a solder reflow technique to interconnect top layer vias and bond pads to lower layer bond pads or vias to form "ministacks" of die. If solder is used for interconnection, a suitable epoxy such as Epotek 353 from Epoxy Technology, is used for the bonding of the layers and the stack is reflowed to form the desired electrical connections. The use of a Z-conductive epoxy desirably provides both the necessary adhesive and electrical connections for the layers.

In an alternative embodiment, micro-heat pipe structures, interleaved copper thermal management layers, thermal adhesive film such as ATTA LM-2 available from Btechcorp, thermally conductive adhesives or equivalent thermal management means may be incorporated into the stack where appropriate if in-stack power dissipation or stack thermal management is a concern.

As can be seen, under the present invention, a user may selectively process heterogeneous or homogenous integrated circuit die to form modular, scalable, building blocks of circuits. In this manner, each layer may be designed to form a building block of a desired circuit (e.g. op amp, ADC) that, in turn will be assembled into a final circuit of desired complexity. Alternatively, the ministack formed at this step may result in the final, desired circuit.

An alternative preferred embodiment includes circuit design and die layout specifically providing for efficient bond pad and via locations and for the design of partial circuit "unit cell" layers, that can be assembled as layers to form complete circuits where the vias provide all unit cell interconnections necessary to realize full circuit functionality.

To maximize final stack yield, testing of the ministacks is performed prior to further incorporation into subsequent assemblies. In an alternative preferred embodiment, the ministacks can be bonded and electrically interconnected together to form a stacked electronic module of greater circuit density.

It is important to note that the design and layout with respect to via formation and filling, bond pad exposure, interconnection metallization, and layer interconnection scheme must consider the layer-to-layer bond pad and via registration to ensure accurate and reliable bond pad and via interconnections when the layers are assembled.

By progressively testing and stacking die or die arrays, i.e. die to ministacks to final stacks, yield is greatly improved since a single failed layer or failed ministack is identified early in the manufacturing cycle under the present invention does not result in the loss of a completed multilayer stack.

A preferred embodiment of the invention comprised of defining vias at the reticle/photomask lever fits well with standard semiconductor process steps. As is well known in the semiconductor manufacturing arts, a common series of semiconductor process steps is involved in the manufacturing of integrated circuit die. Generally, such semiconductor process steps comprise:

1. Functional and schematic circuit design,
2. Circuit layout which will be dependant on factors such as feature size, material characteristics and foundry capabilities resulting in a composite circuit layout or drawing from which individual layer patterns are generated,
3. Digitizing each layer drawing,
4. Creating a reticle from each layer drawing comprising an image for directly pattering the image on a wafer or for the generation of a photomask which may comprise multiple reticle images. (Chrome on glass/quartz is a typical reticle construction),
5. Forming an oxide layer on the surface of a semiconductor wafer to form a protective layer and doping barrier,
6. Patterning the oxide layer to define locations for circuit elements,
7. One or more additional layering, patterning and doping operations for the creation of desired circuit elements such as transistors (n-type an/or p-type), capacitors, diodes, resistors and the like, and the creation of insulation and/or conductive regions using appropriate passivation materials (e.g., polysilicon), dopants, and metallization.

Upon completion of the above semiconductor process steps, wafer sort, test and dicing of the wafer for further processing typically follow.

As discussed above, capacitor formation occurs during one or more of the semiconductor process steps. Because of limited wafer surface, trench, (or buried) capacitors, which are etched vertically into the wafer, have been adopted because of their relatively small surface area. Typical sizes of trench capacitors are 2 microns wide by 8 microns deep but much smaller diameter, deeper trench geometries are achievable. A trench capacitor may be formed either isotropically or, preferably, using anisotropic techniques such as dry reactive ion etching. Typically, subsequent trench capacitor processing includes oxidation of the sidewalls of the trench to create a dielectric layer and filling the trench with a deposited polysilicon.

The features of the trench capacitor and the process steps associated with their formation desirably lend themselves toward use as interconnect via structures when modified according to the present invention.

Figure 6:
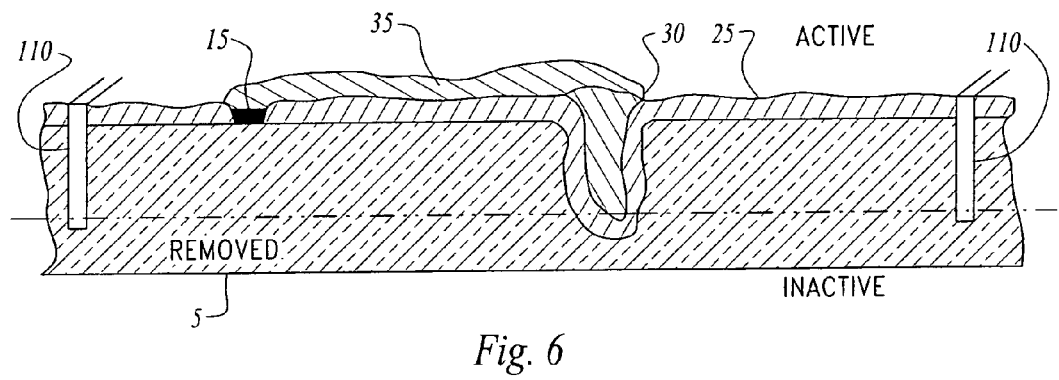
FIG. 6 is a cross-section of a via of the present invention showing the removal of a predetermined portion of the second surface of the substrate to expose the conductive material within the trench and showing predefined grooving along die streets for stress-free singulation of die after backthinning.

An exemplar structure of a trench is shown in FIG. 6 formed on the active first surface of the wafer and also showing the inactive second surface of the wafer.

In a preferred embodiment of the invention, trenches are formed during and as part of the above semiconductor process steps relating to formation of electrical circuitry on the wafer surface. After the trench formation, such as by DRIE process, and interior trench surface oxidation, the trench interior is at least partially filled with doped polysilicon such as by deposition processes well known in the industry. The polysilicon is doped using diffusion before, or implantation after, deposition to provide a predetermined resistivity in the polysilicon material. It has been determined that doping polysilicon decreases resistance allowing the polysilicon to act as a conductor within the trench structure.

Alternatively, the interior of the trench structure may be plated or substantially filled with a suitable conductive material, such as a metal whereby the interior of the trench defines a conductive region.

Upon completion of the semiconductor process steps necessary to form the integrated circuitry on the active surface of the wafer, which steps include the trench formation and conductor fill, a predetermined portion of the inactive surface of the die is removed to expose the conductive polysilicon or metal to define a high aspect ratio, conductive via. A cross-section of an exemplar trench, before and after removal of a predetermined portion 100 of the inactive surface is shown in FIG. 6.

Note that the die streets can be grooved with a dicing saw or equivalent means to create grooves 110 of a predetermined depth that is lower than the depth of the active circuitry on the chips, about the periphery of the die (i.e., the die streets) on the wafer.

As is disclosed in U.S. patent application Ser. No. 09/190, 378 filed Nov. 10, 1998, entitled "Method for Thinning Semiconductor Wafers with Circuits and Wafers Made by the Same", above, when the inactive surface of the grooved wafer is backthinned up to the groove depth, the resultant die are concurrently backthinned and singulated in a manner that minimizes mechanical stresses on the die. By way of example and not by limitation of the steps associated with the use of the preformed grooving embodiment of the invention, (also referred to as a "dice before grind"), are:

1. Defining grooves about the periphery of the die ("die streets") by use of a wafer dicing machine as is well known in the industry. Depending of the desired final thickness of the wafer, a preferred groove depth is 25-50 microns beyond final desired thickness of die,
2. Coating active side of wafer with temporary releasable adhesive such as Crystalbond 509 from Aremco,
3. Bonding the active surface of the grooved wafer to a substrate such as planar quartz plate with the temporary releasable adhesive,
4. Backgrinding wafer to desired thickness beyond depth of groove until die are singulated and the via conductor exposed, such as by using mechanical, chemical or CMP processes,
5. Demounting the now singulated die such as by soaking the quartz plate and singulated die in acetone to release die from the quartz plate.

The removal of a predetermined portion of the inactive surface may occur before or after dicing, i.e., at the wafer level, and may be done by chemical, mechanical or combined chemical/mechanical polishing methods as are common in industry.

Figure 7:
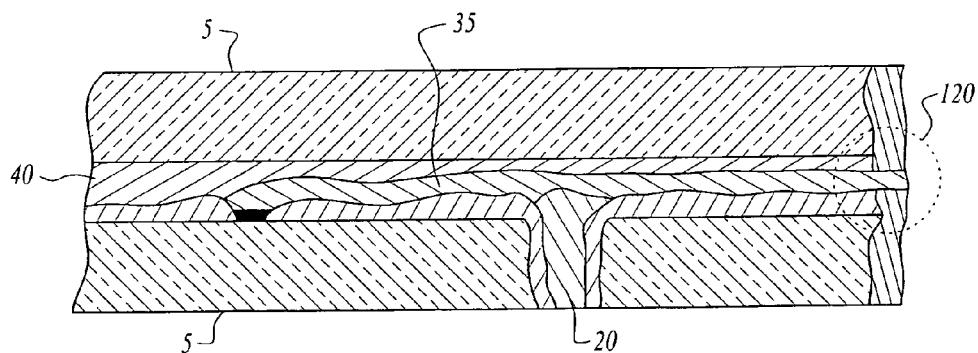
FIG. 7 shows a cross-section of the T-connect of the present invention.

In yet a further alternative embodiment of the invention, the stack of semi-conductor chips, or substrates, may each have a passivation layer disposed over the surface of each layer. Individual I/O pads are exposed and/or the conductive material within the vias rerouted to desired locations (e.g., other I/O pads, one or more conductive vias and the like) upon the passivated surface using plated-on metallized conductive paths. Further, the I/O pads of a layer can be rerouted to the edge of the layer whereby they are subsequently interconnection. After each layer is stacked to form a module with lateral surfaces, the terminated edge traces are exposed using a semiconductor etch back process. The exposed leads can then be interconnected using plated-on metal "side bussing" on the lateral surfaces of the module to form T-connects which further increases interconnection density. An exemplar T-connect 120 structure is shown in FIG. 7.

From the foregoing description, it will be apparent the apparatus and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact the elements of a claim are set forth below in a certain combination, it must be expressly understood that the invention includes other combinations of fewer, more or different elements, which are disclosed above even though not claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Although elements may be described above as acting in certain combinations and even initially claimed as such, it is to be expressly understood that one or more elements from a claimed combination can in some cases be excised from the combination and that the claimed combination may be directed to a sub-combination or variation of a sub-combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. An electronic module comprising:
a plurality of semiconductor chip layers, wherein at least one of the plurality of semiconductor chip layers includes a semiconductor substrate having a first surface and a second surface;
electronic circuitry comprising a plurality of circuit elements defined on the first surface during a predetermined series of semiconductor process steps using a predetermined reticle set;
a trench having an interior surface between at least one of the plurality of circuit elements and the second surface, wherein the trench is defined concurrently with the electronic circuitry during the predetermined series of semiconductor process steps using the predetermined reticle set;
a dielectric material located on the interior surface;
an electrically conductive material located on the dielectric material;
an electrically conductive via defined by removing a predetermined portion of the second surface to expose the electrically conductive material, wherein the plurality of semiconductor chip layers are stacked and bonded to form a module, and wherein the electrically conductive via electrically couples the electronic circuitry of the at least one of the plurality of semiconductor chip layers to the electronic circuitry of at least one other of the plurality of semiconductor chip layers in the electronic module; and
an element disposed between at least two of the plurality of semiconductor chip layers and configured to provide thermal management for at least one of the plurality of semiconductor chip layers.

2. The electronic module of claim 1, wherein the element configured to provide thermal management comprises a thermally-conductive adhesive.

3. The electronic module of claim 1, wherein the element configured to provide thermal management comprises a thermally-conductive epoxy.

4. The electronic module of claim 1, further comprising at least one T-connect.

5. The electronic module of claim 1, wherein at least two of the plurality of semiconductor chip layers are bonded together with a Z-conductive epoxy.

6. An electronic module comprising:
a plurality of semiconductor chip layers; and
an element located between two of the plurality of semiconductor chip layers and configured to provide thermal management for at least one of the plurality of semiconductor chip layers;
wherein at least one of the plurality of semiconductor chip layers includes:
a substrate comprising a first surface and a second surface;
electronic circuitry comprising a circuit element formed on the first surface;
a trench located in the first surface between the circuit element and the second surface of the substrate, wherein the trench has an interior surface;
a dielectric material on the interior surface of the trench; and
a conductive material located within the trench and configured to form an electrically conductive via between the first and second surfaces of the substrate, wherein the electrically conductive via is electrically connected to the electronic circuitry.

7. The electronic module of claim 6, wherein the element configured to provide thermal management comprises a thermally-conductive adhesive film.

8. The electronic module of claim 6, wherein the element configured to provide thermal management comprises a micro-heat pipe structure.

9. The electronic module of claim 6, wherein the element configured to provide thermal management comprises an interleaved-copper thermal-management layer.

10. The electronic module of claim 6, wherein the at least one of the plurality of semiconductor chip layers is backthinned.

11. The electronic module of claim 6, wherein the at least one of the plurality of semiconductor chip layers further comprises a bond pad electrically connected to and disposed between the electronic circuitry and the electrically conductive via.

12. The electronic module of claim 6, wherein the at least one of the plurality of semiconductor chip layers further comprises a passivation layer disposed over at least a portion of the at least one of the plurality of semiconductor chip layers.

13. The electronic module of claim 6, wherein the at least one of the plurality of semiconductor chip layers further comprises a conductive trace configured to electrically connect a bond pad to the electrically conductive via.

14. The electronic module of claim 13, wherein the bond pad is disposed on the first surface of the substrate at a distance from the electrically conductive via, and wherein the conductive trace extends along the first surface of the substrate between the bond pad and the electrically conductive via.

15. The electronic module of claim 6, wherein the at least one of the plurality of semiconductor chip layers further includes a conductive trace configured to electrically connect the electrically conductive via to a conductive T-connect structure at a lateral surface of the electronic module.

16. The electronic module of claim 6, wherein the conductive material comprises at least one of a doped polysilicon or a metal.

17. An electronic module comprising:
an element located between a first semiconductor chip layer and a second semiconductor chip layer and configured to provide thermal management for at least one of the first and second semiconductor chip layers, wherein the first and second semiconductor chip layers each include:
a substrate comprising a first surface and a second surface, wherein the first surface has electronic circuitry provided thereon;
a trench in the first surface between the electronic circuitry and the second surface, wherein the trench has an interior surface covered, at least in part, by a dielectric material; and
a conductive material disposed within the trench to form an electrically conductive via between the first and second surfaces of the substrate.

18. The electronic module of claim 17, wherein the element configured to provide thermal management comprises a thermally-conductive adhesive film, a micro-heat pipe structure, or an interleaved-copper thermal-management layer.

19. The electronic module of claim 17, wherein at least one of the first or second semiconductor chip layers is backthinned.

20. The electronic module of claim 17, wherein the first semiconductor chip layer further comprises a bond pad electrically connected to the electrically conductive via.

21. The electronic module of claim 17, further comprising an electrically conductive trace extending along the first surface and configured to electrically connect the electrically conductive via to a bond pad disposed at a horizontal distance from the electrically conductive via.

22. The electronic module of claim 17, wherein the first semiconductor chip layer further comprises a passivation layer disposed over at least a portion of the first or second surface of the first semiconductor chip layer.

23. The electronic module of claim 17, further comprising a conductive bus disposed on a lateral surface of the electronic module and electrically connected to at least one of the first or second semiconductor chip layers.

24. The electronic module of claim 23, wherein at least one of the first or second semiconductor chip layers is electrically connected to the conductive bus by a conductive T-connect structure.

25. The electronic module of claim 24, wherein the conductive T-connect structure is electrically connected to a conductive trace that is electrically connected to an input/output (I/O) pad.

26. A semiconductor chip layer comprising:
a substrate including a first surface and a second surface;
electronic circuitry including a circuit element disposed on the first surface;
a trench in the first surface between the circuit element and the second surface of the substrate, wherein the trench has an interior surface with a dielectric material thereon;
a conductive material disposed within the trench and configured to act as an electrically conductive via between the first surface of the substrate and the second surface of the substrate; and
an element adjacent to at least one of the first or second surfaces of the substrate and configured to provide thermal management for at least one of the substrate or the electronic circuitry.

27. The semiconductor chip layer of claim 26, wherein the element configured to provide thermal management comprises a thermally-conductive adhesive film, a micro-heat pipe structure, or an interleaved-copper thermal-management layer.

28. The semiconductor chip layer of claim 26, wherein the semiconductor chip layer is backthinned.

29. The semiconductor chip layer of claim 26, further comprising a bond pad electrically connected to the electrically conductive via.

30. The semiconductor chip layer of claim 29, further comprising a conductive trace configured to electrically connect the bond pad to the electrically conductive via.

31. The semiconductor chip layer of claim 30, wherein the bond pad is disposed on the first surface at a horizontal distance from the electrically conductive via, and wherein the conductive trace extends along the first surface between the bond pad and the electrically conductive via.

32. The semiconductor chip layer of claim 26, further comprising a passivation layer disposed over at least a portion of the semiconductor chip layer.

33. The semiconductor chip layer of claim 26, further comprising a conductive T-connect structure configured to electrically connect a conductive trace to a conductive bus at a lateral surface of the semiconductor chip layer.

34. The semiconductor chip layer of claim 33, wherein the conductive trace is electrically connected to an input/output (I/O) pad.

* * * * *